US006248605B1

(12) United States Patent
Härkönen et al.

(10) Patent No.: US 6,248,605 B1
(45) Date of Patent: Jun. 19, 2001

(54) METHOD OF GROWING THIN FILM ELECTROLUMINESCENT STRUCTURES

(75) Inventors: Gitte Härkönen; Tomi Kervinen; Erkki Soininen, all of Espoo (FI); Runar Törnqvist, Kauniainen (FI); Kirsi Vasama, Järvenpää (FI); Mario Glanz; Herbert Schumann, both of Berlin (DE)

(73) Assignee: Planar Systems Inc., Espoo (FI)

( * ) Notice: Subject to any disclaimer, the term of this patent is extended or adjusted under 35 U.S.C. 154(b) by 0 days.

(21) Appl. No.: 09/323,821

(22) Filed: Jun. 2, 1999

(30) Foreign Application Priority Data

Jun. 3, 1998 (FI) ........................................................ 981262

(51) Int. Cl.$^7$ ............................. H01L 21/00; B05D 5/06; H01J 1/62
(52) U.S. Cl. ................................ 438/29; 438/45; 438/46; 427/66; 313/503
(58) Field of Search ................................ 438/29, 45, 46; 427/66; 313/502, 503

(56) References Cited

U.S. PATENT DOCUMENTS

| | | | |
|---|---|---|---|
| 4,727,003 | * 2/1988 | Ohseto et al. | 428/690 |
| 4,862,033 | * 8/1989 | Migita et al. | 313/502 |
| 5,482,603 | * 1/1996 | Kawashima et al. | 204/192.26 |
| 5,496,582 | 3/1996 | Mizutani et al. . | |
| 5,677,594 | * 10/1997 | Sun et al. | 313/503 |
| 6,004,618 | * 12/1999 | Mizutani et al. | 427/66 |

OTHER PUBLICATIONS

"New Deposition Process for Very Blue and Bright SrS:Ce, CI TFT Devices", K.O. Velthaus et al., SID 1997 Digest, pp. 411–414.*
"Color by White," R.O. Tornqvist, TFEL. SID 1997 Digest, pp. 855–858.

"New Deposition Process for Very Blue and Bright SrS:Ce, C1 TFEL Devices," K.O. Velthaus, et al. SID 1997 Digest, pp. 411–414.
"A Novel Deposition Method for Thin Film Electroluminescent Devices," R. Hiskes, et al. First International Conference on the Science and Technology of Display Phosphors, San Diego, 1995, pp. 137–139.
"Bright and stable blue electroluminescent device based on SrS: Ce," E. Solininen, et al. 13$^{th}$ International Display Research Conference 1993, pp. 233–236.
"Broadband double layer phosphor for an inverted filtered RGB electroluminescent display," M. Leppanen, et al. 13$^{th}$ International Display Research Conference 1993, p. 229–232.
"42.1: 512 (x3) x 256 RGB Multicolor TFEL Display Based on 'Color by White,'" J. Haaranen, et al. SID 1995 Digest, p. 883–886.
"Bright 320 (x3) .240 RGB TFEL Display Based on 'Color by White,'" T. Harju, et al. SID 1997 Digest, pp. 859–861.
"High Efficiency SrS, SrSe: CeCl$_3$ based thin film electroluminescent devices," R.H. Mauch, et al. Journal of Crystal Growth, V. 117 (1992) pp. 964–968.
"Thin Yttrium and Rare Earth Oxide Films Produced by Plasma Enhanced CVD of Novel Organometallic II–Complexes," A. Weber, et al. Applied Physics A 51 (1990), pp. 520–525.
"Green Emitting Thin–Film Electroluminescent Device Grown by Atomic Layer Epitaxy," G. Harkonen, et al. SID 1990 Digest, pp. 232–235.

* cited by examiner

Primary Examiner—John F. Niebling
Assistant Examiner—Viktor Simkovic
(74) Attorney, Agent, or Firm—McDermott, Will & Emery (57) ABSTRACT

The present invention concerns a method of growing a cerium-doped SrS phosphor layer by the Atomic Layer Epitaxy-method. According to the invention an organometallic cerium compound containing at least one cyclopentadienyl type ligand is used as a precursor for the dopant cerium. The cyclopentadienyl type cerium compounds can be used as ALE precursors at about 400° C. substrate temperatures without any observable thermal decomposition during processing.

18 Claims, 5 Drawing Sheets

METHOD OF GROWING THIN FILM ELECTROLUMINESCENT STRUCTURES

BACKGROUND OF THE INVENTION

1. Field of the Invention

This invention relates to light emitting phosphor films with uniform and bright emission. In particular, the invention relates to a method of producing a cerium-doped SrS phosphor layers for thin film electroluminescent devices.

2. Description of Related Art

Thin film electroluminescent (TFEL) flat panel displays are used in applications where a wide viewing angle, wide temperature range and a rugged structure are important. All yellow emitting monochrome and red and green emitting multicolor TFEL displays existing on the market today are based on the ZnS:Mn light emitting phosphor.

Significant efforts have been and are being made to develop a blue emitting TFEL phosphor, which is necessary in order to realise a full colour TFEL display. The most promising phosphor for this purpose is SrS:Ce (R.O. Törnqvist, TFEL "Color by White", SID 1997 DIGEST, p. 855), which has a wide emission spectrum ranging from the blue spectral region to the red with a maximum near 500 nm.

The full color TFEL display structure embodies the ZnS:Mn and SrS:Ce phosphors stacked on top of each other. The primary colors are obtained by using color filters in the front. This "color by white" TFEL concept is adapted in both direct view and active matrix full color TFEL displays, which are under development.

SrS:Ce thin films have been fabricated by physical vapour deposition techniques such as Thermal Evaporation (under Molecular Beam Epitaxy or Hot Wall Deposition conditions), Electron Beam Evaporation, and Sputtering, by chemical vapour deposition techniques like Metalorganic Chemical Vapour Deposition and Atomic Layer Epitaxy (in the following abbreviated "ALE") and by mixed techniques such as Chemical Beam Epitaxy and Reactive Evaporation. Best results in terms of dot luminance and dot luminous efficiency have been achieved with Molecular Beam Epitaxy (MBE) (K. O. Velthaus, B. Huttl, U. Troppenz, R. Herrman and R. Mauch, New deposition process for very blue and bright SrS:Ce,Cl TFEL devices, SID 1997 DIGEST, p. 411). In these devices additional codoping is done with chlorine, manganese and silver with the aim of improving the stoichiometry and crystallinity of the SrS matrix and also to achieve charge compensation for the $Ce^{3+}$ doping (by $Ag^+$). Starting materials are Sr, S, $CeCl_3$, Mn and Ag. The possibilities of upscaling this process for production are not known. Rather good results have been achieved with sputtered and Electron Beam Evaporation deposited SrS:Ce. In MOCVD $Sr(thd)_2$ and $Ce(thd)_4$ (wherein the abbreviation thd stands for 2,2,6,6-tetramethyl-3,5-heptanedionate) have been used for growing SrS:Ce EL films (R. Hiskes, S. A. DiCarolis, R. Müller-Mach, V. Mazzi, K. Nauka, and G. O. Müller, A Novel deposition Method for Thin Film Electroluminescent Devices, Extended Abstracts, $1^{st}$ Int. Conference on the Science and Technology of Display Phosphors, San Diego, 1995, p. 137), but no significant results have been reported. Improved SrS:Ce TFEL performance has been claimed when bis(cyclopentadienyl) strontium, $Sr(Cp)_2$, and $Ce(thd)_4$ have been used instead of $Sr(thd)_2$ and $Ce(thd)_4$ because of higher vapor pressure and better controllability of $Sr(Cp)_2$ (U.S. Pat. No. 5,496,582, Mizutani K. et al.). Only qualitative results are given in the prior art.

Up till now the best SrS:Ce electroluminescent thin films by the ALE method have been made using $Sr(thd)_2$, $Ce(thd)_4$ and hydrogen sulfide as precursors (B. Soininen, M. Leppänen, and A. Pakkala, Bright and stable electroluminescent device based on SrS:Ce, 13th International Display Research Conference 1993, p. 233). This process has been used in fabricating multicolor thin film electroluminescent displays (M. Leppänen, G. Härkönen, A. Pakkala, E. Soininen and R. Törnqvist, Broadband double layer phosphor for an inverted filtered RGB electroluminescent display, 13th International Display Research Conference 1993, p. 229, Haaranen et al., 521(×3)×256 RGB multicolor TFEL display based on "Color by white", SID 1995 Digest p. 883, and Harju et al., Bright 320(×3)×240 RGB TFEL display based on "Color by white", SID 1997 Digest p. 859). In the growth of the phosphor film the surface is sequentially exposed to $Sr(thd)_2$ vapor and hydrogen sulphide, where first the Sr reactant is adsorbed on the surface and subsequently it reacts with $H_2S$ for growing the host material, SrS. The dopant is added to the structure by periodically exposing the SrS surface sequentially to $Ce(thd)_4$ and hydrogen sulfide.

In EL display panel manufacturing good uniformity of the deposited thin films is essential both from a manufacturing cost and a panel performance point of view. The main issue in color TFEL panels made by ALE has been the strong luminance profile of the SrS:Ce film when e.g. $Ce(thd)_4$ is used for doping with cerium, especially because of a reduced luminance in the gas inlet part of the substrate. This is believed to be due to either the sticking and thermal decomposition properties of the precursor when reaching the substrate or to the incorporation of harmful additives transported to the surface via the precursor. The non-ideal SrS:Ce uniformity behaviour has been tracked down to be mainly due to the Ce precursor used.

A secondary issue is that typically cerium precursors used up till now at the temperature and pressure needed for suitable volatility have all been solid state, which is less desirable from a manufacturing process point of view. To reduce possible particle contamination, and also to minimise labour costs, liquid and gas sources would be preferred.

ALE is a powerful deposition method to tailor the dopant/host ratio in the films as molecular layer accuracy can be reached in placing the dopant into a desired position inside the host material in growth direction perpendicular to the substrate surface. This has been utilised in order to enhance the crystallinity of the host material by planar doping (Härkönen G. et al., Green emitting thin film electroluminescent device grown by Atomic Layer Epitaxy, SID 1990 Digest p. 232). It is more difficult to control the dopant concentration in the doping plane parallel to the substrate surface because, in such a case, the surface concentration is dependent on the precursor adsorption/desorption kinetics, sticking to the surface, reactivity and thermal stability. In the case of Ce, less than a monolayer adsorption is desirable. If there is interaction between adjacent Ce ions the color will shift towards higher wavelengths. Ce does not thermally diffuse in the SrS host at the used temperatures (<520° C.) and thus the excess of the precursor should be removed from the surface or the material pulse should be poor enough to begin with. Good uniformity cannot be achived using a thd precursor.

Volatile, thermally stable but on the other hand reactive enough precursors for Ce are not abundant. Several β-diketonates and amide complexes tested have not produced enough luminance, not to mention an acceptable luminance uniformity in the ALE grown SrS:Ce. With other methods (R. H. Mauch, K. O. Velthaus, G. Bilger, and H. W.

Schock, High efficiency SrS,SrCe:CeCl3 based thin film electroluminescent devices, J. Cryst. Growth 117 (1992) 964–968), it has been shown that by lowering the Ce content, the blue component can be enhanced. This has not been possible to realise with the Ce(thd)$_4$ precursor.

SUMMARY OF THE INVENTION

It is an object of the present invention to improve the performance, in particular the luminance uniformity, of SrS:Ce films grown with Atomic Layer Epitaxy (ALE) by employing compounds for cerium that have not been used before.

It is another object of the invention to provide a novel process for producing light emitting phosphor films.

It is a third object of the present invention to provide a new use of cyclopentadienyl compounds.

These and other objectives, together with the advantages thereof over known processes, which shall become apparent from the following specification, are accomplished by the invention as hereinafter described and claimed.

The present invention is based on using an organometallic cerium compound which contains at least one cyclopentadienyl type ligand as a precursor for cerium used as a dopant for SrS phosphor layers grown by the Atomic Layer Epitaxy -method. Surprisingly it has been found that cyclopentadienyl precursors for Ce exhibit an adsorption/desorption behaviour desirable for good ALE dopant precursors at the substrate surface where the amount of Ce on the substrate surface can be controlled. By using cyclopentadienyl compounds for Ce, the above mentioned disadvantages of the prior art can be overcome; the doping is more controlled and the performance of the SrS:Ce films is improved.

More specifically, the present invention is characterized by what is stated in the characterizing parts of claims 1 and 5.

The present invention achieves considerable advantages. Thus, during the testing of several precursors and analysing the results from the films it was realised that cyclopentadienyl type of cerium compounds can be used as ALE precursors at about 400° C. substrate temperatures without any observable thermal decomposition during processing. This was shown by measuring the carbon and hydrogen concentrations in the grown SrS:Ce films by Secondary Ion Mass Spectroscopy (SIMS) whereby it was established that the level of these impurities was not higher than in reference samples without cerium doping. A further proof supporting the good thermal stability is the uniform cerium concentration over the substrate area that results when using these cerium compounds (see Example 3).

The luminance level is increased and the luminance uniformity is substantially improved. The color hue can be controllably changed and the processing is robust.

It was also found that despite of the fact that the cyclopentadienyl type of cerium compounds are very sensitive to oxygen and humidity it is possible to use them in ALE processing equipment. An advantageously simple and inexpensive inert loading system has been developed and attached to the ALE processing equipment (see FIG. 2).

Furthermore, some of the cyclopentadienyl type of cerium compounds are advantageously in liquid state at their vaporisation temperatures, minimising potential particle-induced production yield losses.

Next the invention will be examined more closely with the aid of a detailed description and with reference to a number of working examples.

BRIEF DESCRIPTION OF THE DRAWINGS

In the attached drawings.

DETAILED DESCRIPTION OF THE INVENTION

The present invention discloses a method of growing electroluminescent SrS:Ce thin films. The particulars of the novel process are outlined as follows:

The growth of the SrS:Ce thin film is implemented using the ALE method, that is, using a pulsed infeed of the anion and cation initial reactants in an alternating sequence so as to prevent the surface of the substrate located in the reaction chamber from becoming simultaneously exposed to both initial reactants. The thin film growth process comprises growth steps of strontium sulphide layers followed by a cerium doping step, whereby all the steps are repeated in alternating sequences until the desired film thickness is obtained. Details of the ALE method are described in U.S. Pat. Nos. 4,058,430 and 4,389,973, which are herewith incorporated by reference.

The temperature at the growth process is controlled and set high enough to prevent the precursor from condensing on the substrate surface but simultaneously sufficiently low to essentially avoid thermal decomposition. The substrate temperature is for SrS:Ce growth processes typically between 250 and 450° C. The surface reactions take place at a low pressure in the region of 0.1 to 10 torr.

A volatile Sr compound is used as a Sr precursor together with $H_2S$ to form SrS and a cyclopentadienyl type of Ce precursor is used for doping the SrS host. The Ce precursor generally has the formula (I)

wherein

R stands for a hydrocarbyl radical n is an integer 1 to 3 and

Cp stands for a radical of the formula (II)

wherein x and y each independently stand for an integer 1–5, x+y=z and z≦5, and $R^1$ and $R^2$ each independently stand for a lower alkyl.

Thus, the present invention comprises using a cerium precursor of cyclopentadienyl type including MonoCp, DiCp and TriCp compounds of cerium. Preferably, the Ce precursor is a compound selected from the group of tricyclopentadienyl and alkyl-substituted tricyclopentadienyl derivatives of cerium. Examples are tetramethyl- and isopropyl-substituted Ce-tricyclopentadienyl compounds.

The introduction of air sensitive precursors into the ALE processing equipment (reactor) is carried out inertly by using as inert loading system consisting of a $N_2$ cabin and an flexible attachment hose to the ALE reactor source end specifically modified for this purpose.

By virtue of the present invention a thin film electroluminescent component can be prepared comprising a substrate which can be glass, a ceramic material e.g. $Al_2O_3$ or silicon, with or without a diffusion barrier layer depending on the choice of the substrate. The first and second aligned set of patterned electrodes are made of conducting material e.g. indium tin oxide, doped zinc oxide, Al, W or Mo. The insulating layers between the electrodes and the light emitting layer consist of a metal oxide or several metal oxides or a composite structure of metal oxides e.g. aluminium oxide titanium oxide multilayer structures, $Al_xTi_yO_z$, tantalum oxide and strontium titanium oxide. The SrS:Ce layer is deposited using the above described technique. Other light emitting layers e.g. ZnS:Mn can be added below and/or above the SrS:Ce layer to form together a multiple layered light emitting phosphor layer possibly using an insulator layer in between the phosphor layers. Preferably an additional insulator layer e.g. of the above-mentioned composition is deposited between said cerium-doped phosphor layer and said additional phosphor layer. The additional phosphor layer can be selected from the group consisting of SrS:Ce; SrS:X; SrS:Ce, X, wherein X is one or several additional dopants; and ZnS:Mn.

The first phosphor layer can contain a codopant Z. The codopant Z can be selected from the group consisting of Na, K, F, Cl, Ga and Ag.

In summary, a preferred embodiment of the process for growing a light-emitting thin film electroluminescent component with a cerium-doped phosphor layer on a substrate by the Atomic Layer Epitaxy-method using volatile compounds as precursors for the ceriumdoped phosphor layer, comprises the steps of providing a substrate;

forming a first set of electrodes on said substrate;

forming a first insulator layer on said electrodes;

growing a phosphor layer on said first insulator layer;

doping said phosphor layer with cerium using an organometallic cerium compound comprising at least one cyclopentadienyl type ligand;

forming a second insulator layer on said phosphor layer; and forming a second set of electrodes on said second insulator layer.

The following non-limiting Examples illustrate the invention:

EXAMPLE 1

Figure 1:
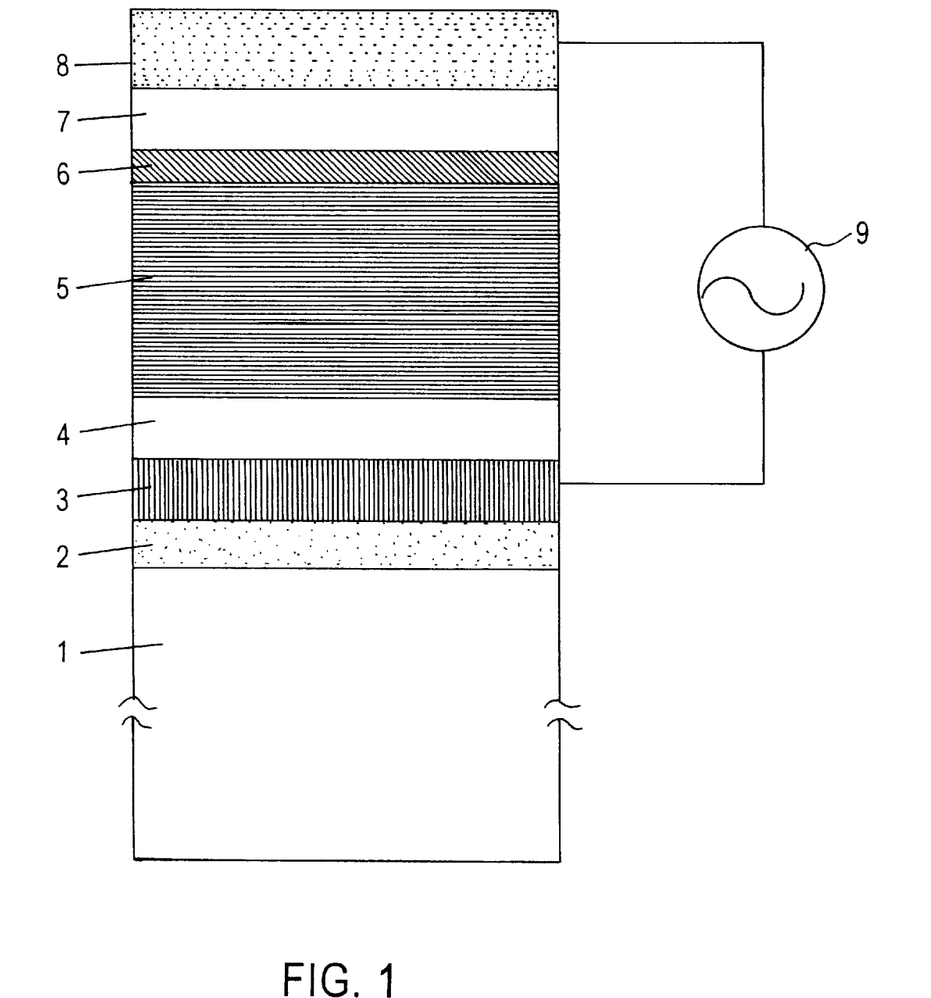
FIG. 1 is a cross sectional view of the thin film electroluminescent device which shows the stacked phosphor/dielectric/electrode structure according to one embodiment of the present invention.

Comparison Between SrS:Ce TFEL Devices Grown By ALE Using Either a β-diketonato Complex or a Cyclopentadienyl Compound as Cerium Precursor The SrS:Ce TFEL devices were prepared according to FIG. 1 by depositing an $Al_2O_3$ ion diffusion barrier 2 onto a soda lime substrate 1. A transparent ITO conductor 3 is deposited on top of the barrier layer and patterned by a lithographic process. A composite dielectric layer 4 of $Al_xTi_yO_z$ is grown by ALE on top of the ITO electrode. The light emitting SrS:Ce phosphor layer 5 is grown by ALE at 400° C. temperature and at 1.0 torr pressure in case A from $Sr(thd)_2$, $Ce(thd)_4$ and $H_2S$ and in case B from $Sr(thd)_2$, $Ce(tmCp)_3$ and $H_2S$ on top of the lower dielectric layer. The growth sequence for the phosphor layer is that N cycles of $Sr(thd)_2$ and $H_2S$ are sequentially pulsed on the substrate surface producing SrS and after this M cycles of the Ce precursor pulse followed by a $H_2S$ pulse are introduced to the surface. These sequences are repeated L times to obtain the desired phosphor film thickness. On top of the phosphor layer a thin $Al_2O_3$ layer 6 is grown by ALE on top of which a similar upper dielectric layer of $Al_xTi_yO_x$ 7 is deposited by ALE. On top of this film stack an Al electrode 8 is deposited and patterned. The electrodes are connected to a voltage source 9.

Figure 2:
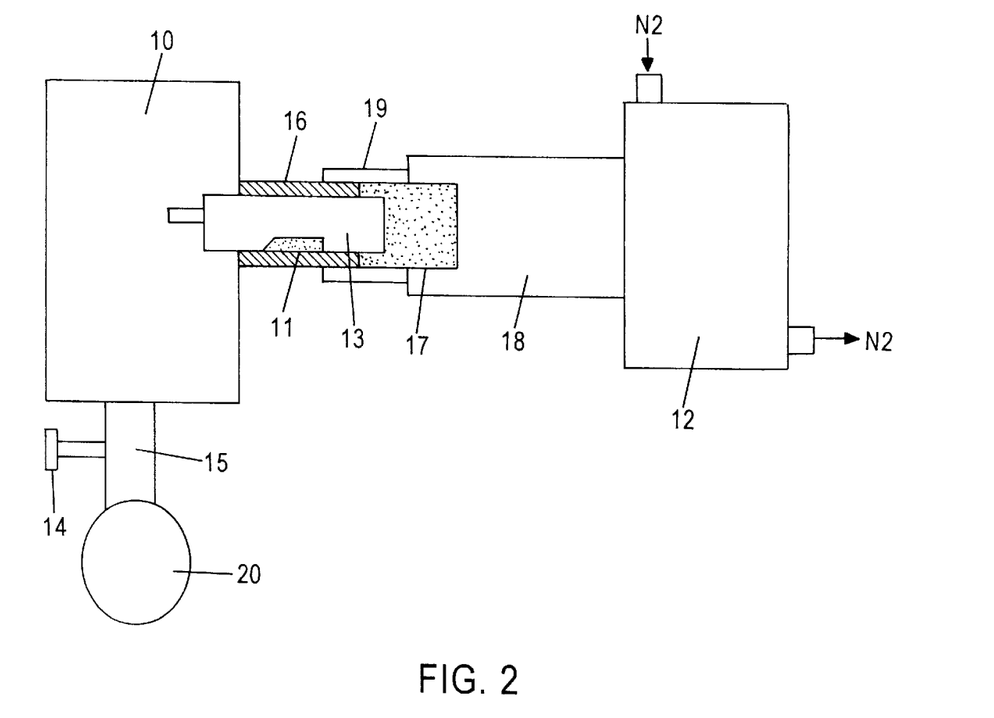
FIG. 2 is a schematic drawing indicating how an inert loading embodiment is used together with an ALE reactor to enable the handling of air sensitive precursors in growing the EL films described in the examples.

When the air sensitive $Ce(tmCp)_3$ is loaded into the ALE reactor, an inert loading system shown in FIG. 2 is used. The cyclopentadienyl precursor 11 is placed first into the $N_2$ filled cabin 12 and the $N_2$ cabin is exposed to a heavy $N_2$ flow (15 SLM) to create a slight over pressure and a continuous purge through the $N_2$ cabin 12. When the atmosphere inside the glove box has low enough oxygen/water vapor content the air sensitive precursor is loaded into the source tube 13 typically used for the ALE reactor 10. The pressure inside the ALE reactor is allowed to slightly exceed the atmospheric pressure by $N_2$ in feed and only a small flange 14 before the pumping line 15 connected to pump 20 is allowed to be opened to the air by the $N_2$ pressure building up inside the reactor. This forms an air lock for the reactor. The ALE source tube containing the desired precursor can be loaded into the ALE reactor source oven 16 from the $N_2$ cabin 12 by opening the source end lock 17 into the $N_2$ cabin and installing the source tube into the reactor through a flexible hose 18 and a fitting piece 19 connecting the $N_2$ cabin to the ALE reactor 10.

In case A when using the $Ce(thd)_4$ precursor the optimal process parameters are N=80, M=1 and L=185. In case B when $Ce(tmCp)_3$ is used for Ce parameters are for N=40, M=1 and L=371. This is to assure that the overall Ce content remain equal for the two cases about 0.25 at-% determined by a calibrated X-ray fluorescence spectrometer (XRF).

Figure 3:
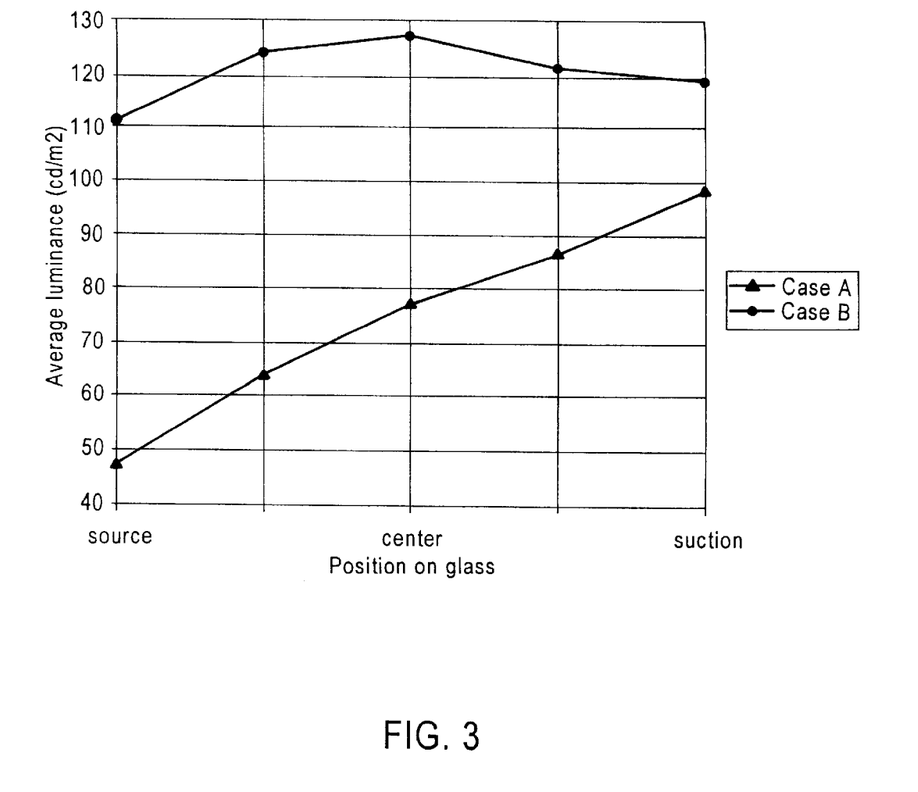
FIG. 3 shows the luminance level and luminance uniformity across the substrate using Ce(thd)$_4$ and Ce(tmCp)$_3$ precursors in a way described in Example 1.

FIG. 3 shows the luminance results from both growth types A and B and the development of the luminance values across the substrate in gas flow direction where "source" refers to inlet part where the precursors first hit the glasses and "suction" to the outlet part where the precursors hit the glasses last. In the measurement set up the components are driven by a pulsed voltage at 60 Hz and the luminance $L_{50}$ is determined as the luminance at 50 V above a threshold voltage where the 5 $cd/m^2$ luminance is reached.

In case B using the cyclopentadienyl type of precursor the luminance nonuniformity defined as $LNU=((L_{max}-L_{max})/L_{max})*100\%$, where Lmax and Lmin are the maximum and minimum luminances across the 195 mm×265 mm substrate used, is 16% whereas in the case A using beta-diketonato precursor the luminance nonuniformity is 59%. The average luminance level in case B is 120 $cd/m^2$ whereas in case A it is only 75 $cd/m^2$ due to a severe decrease in luminance especially at the "source" part of the substrate.

This example proves that using a cyclopentadienyl type of precursor for Ce e.g. $Ce(tmCp)_3$ a better luminous performance is obtained than using a β-diketonato type precursor e.g. $Ce(thd)_4$. The luminance level is increased and the luminance uniformity is improved.

EXAMPLE 2

Shifting the SrS:Ce Emission Color Towards Blue By Controlling the Doping Ratio of the $Ce(Cp)_3$ Precursor SrS:Ce EL devices were prepared under similar conditions, in a similar manner, and into similar thicknesses and compositions to those described in Example 1 except using Ce(Cp)$_3$ as the Ce precursor. In this example M=1, N=20, 40 or 80 and L=742, 371 or 186, respectively. The doping levels are thus Ce:Sr=1:20, 1:40 and 1:80.

The Ce concentrations in the grown SrS:Ce films were 0.4, 0.2, and 0.1 at-%, as determined by calibrated X-ray fluorescence measurements. The luminance L$_{50}$, measured in a similar way to that described in Example 1, was roughly 90 cd/m$^2$ in all these three devices.

Figure 4:
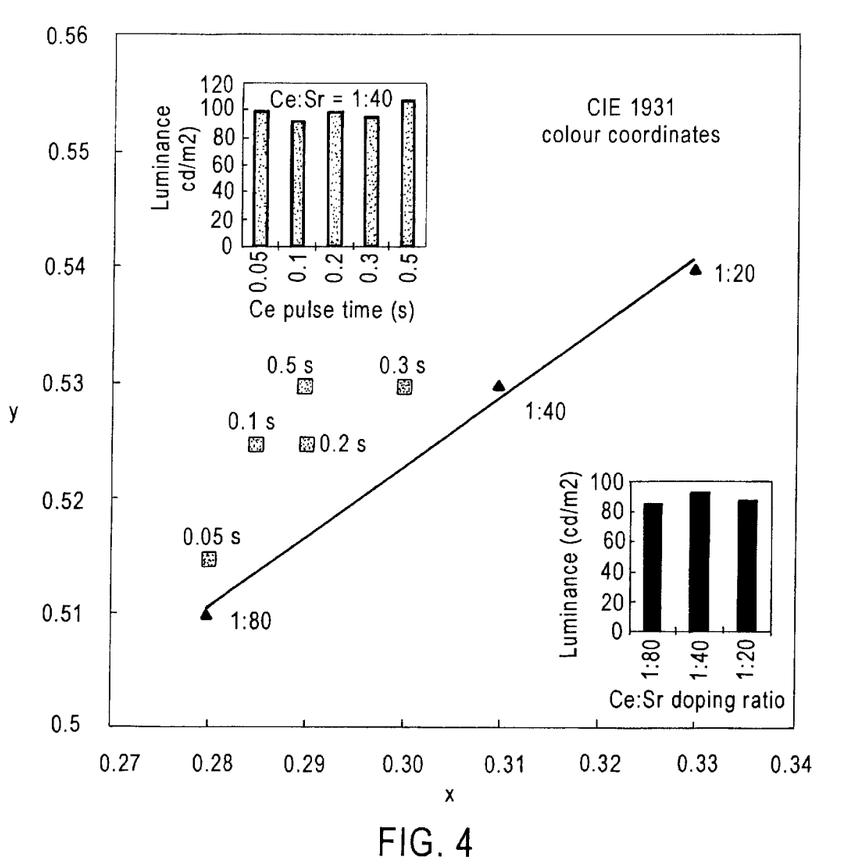
FIG. 4 shows the CIE 1931 color coodinates and luminances of SrS:Ce EL devices prepared as described in Examples 2 and 3.

FIG. 4 shows the CIE 1931 color coodinates and luminances of SrS:Ce EL devices. The triangles depicts the color coordinates and the inset in the lower right hand corner the luminance L40 with three different Ce:Sr doping ratios. The squares picture the color coordinates and the inset in the upper left hand corner the luminance L40 with five different Ce pulse durations using Ce:Sr doping ratio of 1:40

As apparent from FIG. 4, the CIE 1931 colour co-ordinates were (0.33,0.54), (0.30,0.53), and (0.28,0.51) in the devices with Ce:Sr=1:20, 1:40, and 1:80, respectively. Thus, a blue shift corresponding to about 12 nm in the dominant wavelength of the emission has been achieved without a loss of luminance.

It is possible to use the Ce:Sr pulsing ratio to control the emission colour hue also in SrS:Ce devices made with Ce(thd)$_4$. However, a similar blue shift is associated with a more than 50% loss in luminance.

This example proves that by using the SrS:Ce deposition process according to one embodiment of the invention one can shift the colour of the EL emission towards blue without a loss of overall luminance, i.e. one can increase the blue luminance. By using the known SrS:Ce deposition process based on Ce(thd)$_4$, such a blue luminance increase cannot be attained by simply changing the Ce:Sr pulsing ratio.

EXAMPLE 3

Shifting the SrS:Ce Emission Color Towards Blue By Controlling the Dose Length of the Ce(Cp)$_3$ Precursor SrS:Ce EL devices were prepared under similar conditions, in a similar manner, and into similar thicknesses and compositions to those described in Example 1, with the exception that the last grown insulator was only a 100-nm thick Al$_2$O$_3$ and the dopant precursor was Ce(Cp)$_3$. Ce(Cp)$_3$ and H$_2$S were pulsed to the reactor using sequence where N=40, M=1 and L=186. In this set of experiments, the Ce(Cp)$_3$ pulse time was varied from 0.05 to 0.5 s. This is estimated to account for a factor of two to three difference in total Ce(Cp)$_3$ dosage.

Figure 5:
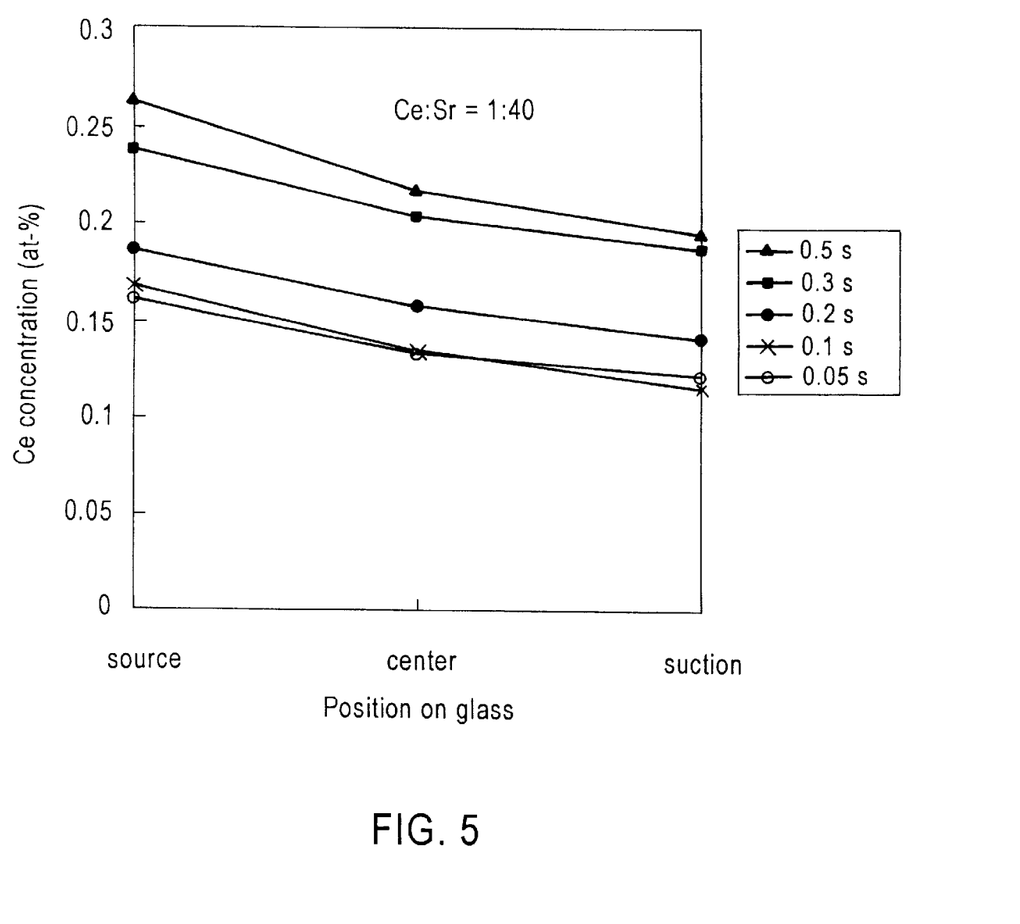
FIG. 5 shows the variation of the Ce concentration in the SrS:Ce thin films over the substrate glass from the inlet part ("source") to the outlet part ("suction").

The Ce concentrations in the grown SrS:Ce films were measured from three positions on the substrate glasses, i.e. in a "source" position (inlet part where the precursors first hit the glasses), in a "center" position, and in a "suction" position (outlet part where the precursors hit the glasses last). The results are shown in FIG. 5. In FIG. 5, the results are from five runs with different Ce pulse durations and a fixed Ce:Sr doping ratio of 1:40, as described in Example 3. The luminance L$_{50}$, measured in a similar way to that described in Example 1, was approximately 100 cd/m$^2$ in all these three devices (see FIG. 4).

The CIE 1931 colour co-ordinates are also depicted in FIG. 4. A blue shift corresponding to about 4 nm in the dominant wavelength of the emission is achieved without a loss of luminance. It is possible to use Ce precursor dosage to change the emission colour hue also in SrS:Ce devices made with Ce(thd)$_4$, but not in a controllable manner.

However, a similar blue shift is associated with a more than 50% loss in luminance and a severe nonuniformity of Ce concentration and luminance over the substrate area.

Examples 2 and 3 show that by using the SrS:Ce deposition process according to one embodiment of the invention there are two ways to shift the colour of the EL emission towards blue without a loss of luminance, i.e. by increasing the Sr precursor and H$_2$S pulse count between each Ce dosing event and by decreasing the Ce precursor pulse length. Example 3 further proves that the invention enables one to reach fairly uniform Ce distributions in the doping planes of SrS:Ce over large substrate areas at different Ce concentrations. By using the known SrS:Ce deposition process based on Ce(thd)$_4$, it has not been demonstrated how to deposit Ce uniformly in doping planes at low Ce concentrations.

EXAMPLE 4

Using Codoping Together with Cyclopentadienyl Type of Precursors

The aim of sodium codoping is to compensate the charge mismatch between Ce$^{3+}$ and Sr$^{2+}$ in SrS host.

SrS:Ce,X EL devices were prepared in a similar manner and under similar conditions to those described in Example 1. The light emitting SrS:Ce phosphor was codoped with X, which in this example is sodium ion. The growth sequence for the phosphor layer was that N cycles of Sr(thd)$_2$ and H$_2$S were sequentially pulsed on the substrate surface producing SrS and after this M cycles of the Ce(Cp)$_3$ pulse followed by a H$_2$S pulse were introduced to the surface. The phosphor thin film was continued with L cycles of SrS and on top of this K layers of Na(thd) and H$_2$S were pulsed sequentially. These sequences were repeated P times to obtain the desired phosphor film thickness.

What is claimed is:

1. A method of growing a cerium-doped SrS phosphor layer by the Atomic Layer Epitaxy -method, comprising using an organometallic cerium compound containing at least one cyclopentadienyl type ligand as a precursor for the dopant cerium.

2. The method according to claim 1, wherein the Ce precursor has the formula (I)

$$CeCp_nR_{3-n} \qquad (I)$$

wherein

R stands for a hydrocarbyl radical n is an integer 1 to 3 and

Cp stands for a radical of the formula (II)

$$C_5R^1{}_xR^2{}_yH_{5-z} \qquad (II)$$

wherein x and y each independently stand for an integer 1–5, x+y=z and z<5, and

R$^1$ and R$^2$ each independently stand for a lower alkyl.

3. The method according to claim 1, wherein the Ce precursor comprises a compound selected from the group of tricyclopentadienyl and alkyl-substituted tricyclopentadienyl derivatives of cerium.

4. A process for growing a light-emitting thin film electroluminescent component with a cerium-doped phosphor layer on a substrate by the Atomic Layer Epitaxy-method using volatile compounds as precursors for the cerium-doped phosphor layer comprising providing a substrate;

forming a first set of electrodes on said substrate;

forming a first insulator layer on said electrodes;

growing a phosphor layer on said first insulator layer;

doping said phosphor layer with cerium using an organometallic cerium compound comprising at least one cyclopentadienyl type ligand;

forming a second insulator layer on said phosphor layer; and forming a second set of electrodes on said second insulator layer.

5. The method according to claim 4, wherein said substrate is selected from the group consisting of glass, ceramic materials and silicon.

6. The method according to claim 4, wherein said electrodes are selected from the group consisting of indium tin oxide, doped zinc oxide, Al, W, Mo and alloys thereof and composite materials.

7. The method according to claim 4, wherein said insulator layers are selected from the group consisting of aluminium oxide titanium oxide multilayer structures, tantalum oxide and strontium titanium oxide.

8. The method according to claim 4, wherein said phosphor layer comprises a SrS:Ce layer.

9. The method according to claim 4, wherein the electroluminescent component is provided with at least one additional phosphor layer.

10. The method according to claim 9, wherein the additional phosphor layer is deposited below or above said cerium-doped phosphor layer.

11. The method according to claim 9, wherein the additional phosphor layers are performed as one or several multilayered structures with said cerium-doped phosphor layer.

12. The method according to claim 9, wherein an additional insulator layer is deposited between said cerium-doped phosphor layer and said additional phosphor layer.

13. The method according to claim 9, wherein said additional phosphor layer is selected from the group consisting of SrS:Ce; SrS:X; SrS:Ce, X, wherein X is one or several additional dopants; and ZnS:Mn.

14. The method according to claim 1, wherein said first phosphor layer contains a codopant Z.

15. The method according to claim 13, wherein the codopant Z is selected from the group consisting of Na, K, F, Cl, Ga and Ag.

16. The method according to claim 1, wherein the ALE reaction is carried out in a reactor space, which is connected to a source oven for feeding the volatile precursors of the phosphor layer to the reactor space, further comprising supplying the volatile precursor of the cerium from an inert loading system comprising an $N_2$ cabin connected to the ALE reactor source oven via a flexible hose and a fitting piece.

17. A method of growing a cerium-doped SrS phosphor layer by the Atomic Layer Epitaxy-method, comprising using an organometallic cerium compound containing at least one cyclopentadienyl type ligand as a precursor for the dopant cerium, wherein the Ce precursor is selected from tetramethyl- and isopropyl-substituted Ce-tricyclopentadienyl compounds.

18. A process for growing a light-emitting thin film electroluminescent component with a cerium-doped phosphor layer on a substrate by the Atomic Layer Epitaxy-method using volatile compounds as precursors for the cerium-doped phosphor layer comprising providing a substrate;

forming a first set of electrodes on said substrate;

forming a first insulator layer on said electrodes;

growing a phosphor layer on said first insulator layer;

doping said phosphor layer with cerium using an organometallic cerium compound selected from tetramethyl- and isopropyl-substituted Ce-tricyclopentadienyl compounds;

forming a second insulator layer on said phosphor layer; and forming a second set of electrodes on said second insulator layer.

* * * * *